(12) United States Patent
Han et al.

(10) Patent No.: US 9,524,923 B2
(45) Date of Patent: Dec. 20, 2016

(54) SEMICONDUCTOR STRUCTURE AND METHOD FOR MANUFACTURING THE SAME

(71) Applicant: UNITED MICROELECTRONICS CORP., Hsinchu (TW)

(72) Inventors: Xiao-Fei Han, Singapore (SG); Jun Qian, Singapore (SG); Ju-Bao Zhang, Singapore (SG)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 14/667,108

(22) Filed: Mar. 24, 2015

(65) Prior Publication Data

US 2016/0225696 A1    Aug. 4, 2016

(30) Foreign Application Priority Data

Jan. 30, 2015   (CN) .......................... 2015 1 0049688

(51) Int. Cl.
*H01L 23/48*     (2006.01)
*H01L 23/532*    (2006.01)
*H01L 21/768*    (2006.01)

(52) U.S. Cl.
CPC ....... *H01L 23/481* (2013.01); *H01L 21/76831* (2013.01); *H01L 21/76843* (2013.01); *H01L 21/76877* (2013.01); *H01L 21/76898* (2013.01); *H01L 23/53238* (2013.01); *H01L 23/53295* (2013.01)

(58) Field of Classification Search
CPC .................... H01L 21/76831; H01L 21/76843; H01L 21/76877; H01L 21/76898; H01L 23/481; H01L 23/53238; H01L 23/53295
See application file for complete search history.

(56) References Cited

U.S. PATENT DOCUMENTS

| | | | |
|---|---|---|---|
| 2010/0244247 A1* | 9/2010 | Chang ............... | H01L 21/76898 257/741 |
| 2011/0217832 A1* | 9/2011 | Raorane ............ | H01L 21/31116 438/589 |
| 2012/0001330 A1* | 1/2012 | Huisinga ........... | H01L 21/76898 257/751 |

* cited by examiner

*Primary Examiner* — Armando Rodriguez
(74) *Attorney, Agent, or Firm* — WPAT, PC; Justin King

(57) ABSTRACT

A semiconductor structure and a method for manufacturing the same are provided. The semiconductor structure comprises a substrate, a through silicon via hole, an interlayer dielectric, a liner layer and a conductor. The through silicon via hole is formed in the substrate. The interlayer dielectric is formed on the substrate. The interlayer dielectric defines an opening corresponding to the through silicon via hole. The interlayer dielectric comprises a bird beak portion near the through silicon via hole. The liner layer is formed on a bottom and a sidewall of the through silicon via hole. The conductor is filled in the through silicon via hole and the opening.

14 Claims, 10 Drawing Sheets

SEMICONDUCTOR STRUCTURE AND METHOD FOR MANUFACTURING THE SAME

This application claims the benefit of People's Republic of China application Serial No. 201510049688.7, filed on Jan. 30, 2015, the subject matter of which is incorporated herein by reference.

TECHNICAL FIELD

This disclosure relates to a semiconductor structure and a method for manufacturing the same. More particularly, this disclosure relates to a semiconductor structure comprising a through silicon via (TSV) and a method for manufacturing the same.

BACKGROUND

Through silicon via is a vertical interconnection (via) completely passing through a wafer or die. Compared to wire bonding or flip-chip stacking, through silicon via can provide a higher interconnect density and a greater space efficiency. In addition, using the through silicon via, the current can pass through a shortest passage of the wafer or die, and thereby the power and the signal can be transferred in a more efficiency way. Further, the resistance can be decreased.

SUMMARY

In this disclosure, a semiconductor structure comprising a through silicon via and a method for manufacturing the same are provided.

According to some embodiment, a semiconductor structure comprises a substrate, a through silicon via hole, an interlayer dielectric, a liner layer and a conductor. The through silicon via hole is formed in the substrate. The interlayer dielectric is formed on the substrate. The interlayer dielectric defines an opening corresponding to the through silicon via hole. The interlayer dielectric comprises a bird beak portion near the through silicon via hole. The liner layer is formed on a bottom and a sidewall of the through silicon via hole. The conductor is filled in the through silicon via hole and the opening.

According to some embodiment, a method for manufacturing a semiconductor structure comprises the following steps. First, a substrate is provided. The substrate has a front side and a back side. A first pad layer and a second pad layer are sequentially formed on the front side and the back side of the substrate. Then, a defining region and a mark are concurrently formed using the first pad layer and the second pad layer on the front side of the substrate. A through silicon via hole is formed in the substrate in the defining region. Then, a liner layer is formed in the through silicon via hole and an interlayer dielectric is formed on the substrate concurrently. The interlayer dielectric defines an opening corresponding to the through silicon via hole. The interlayer dielectric comprises a bird beak portion near the through silicon via hole. Thereafter, a conductor is filled into the through silicon via hole and the opening.

Figure 1A:
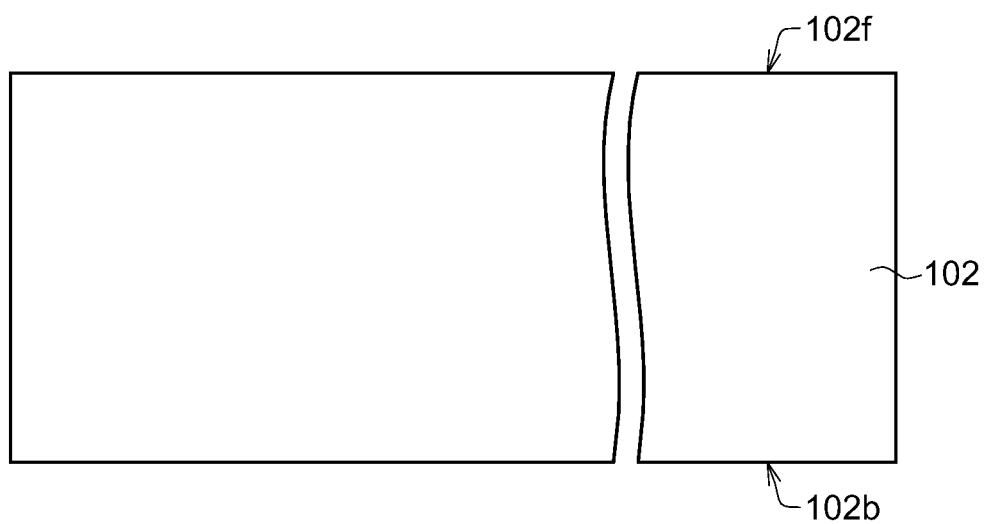
FIGS. 1A-1L illustrate a method for manufacturing a semiconductor structure according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1B:
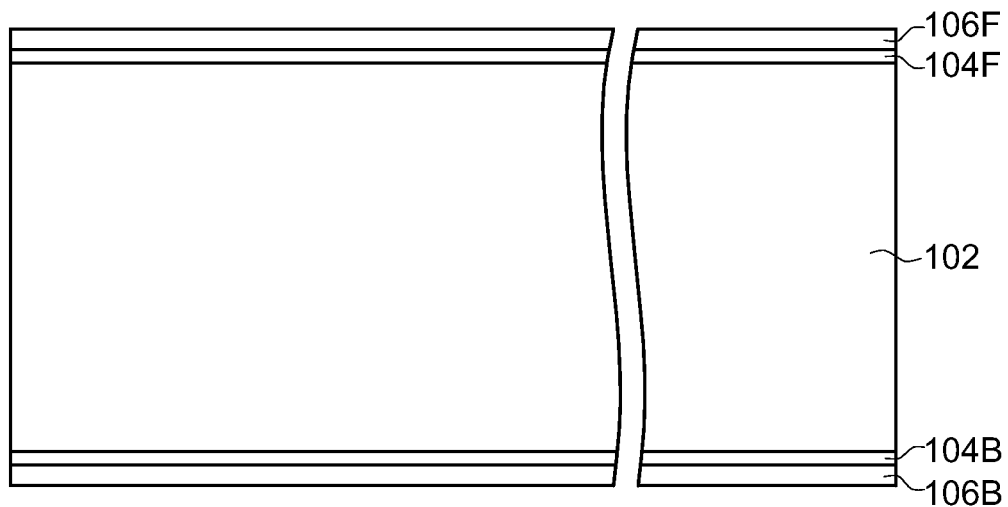
Figure 1C:
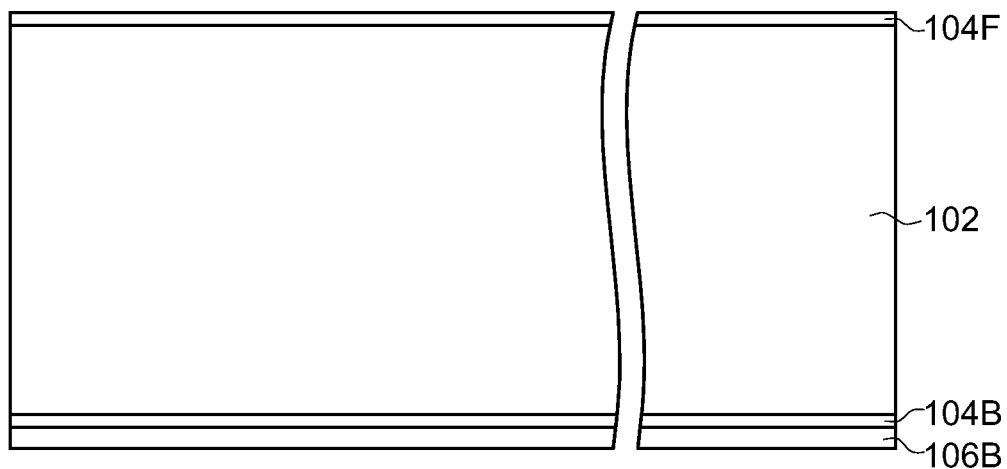

FIGS. 1A-1L illustrate a method for manufacturing a semiconductor structure according to one embodiment. Referring to FIG. 1A, a substrate 102 is provided. The substrate 102 has a front side 102*f* and a back side 102*b*. The substrate 102 may be made of Si. Referring to FIG. 1B, a first pad layer 104F/104B and a second pad layer 106F/106B are sequentially formed on the front side 102*f* and the back side 102*b* of the substrate 102. The first pad layer 104F/104B may be made of oxide, such as $SiO_2$. The second pad layer 106F/106B may be made of nitride, such as SiN. Then, referring to FIG. 1O, the second pad layer 106F on the front side 102*f* of the substrate 102 is removed. This step may be conducted by an etching process. Optionally, a clean process may be carried out.

Figure 1D:
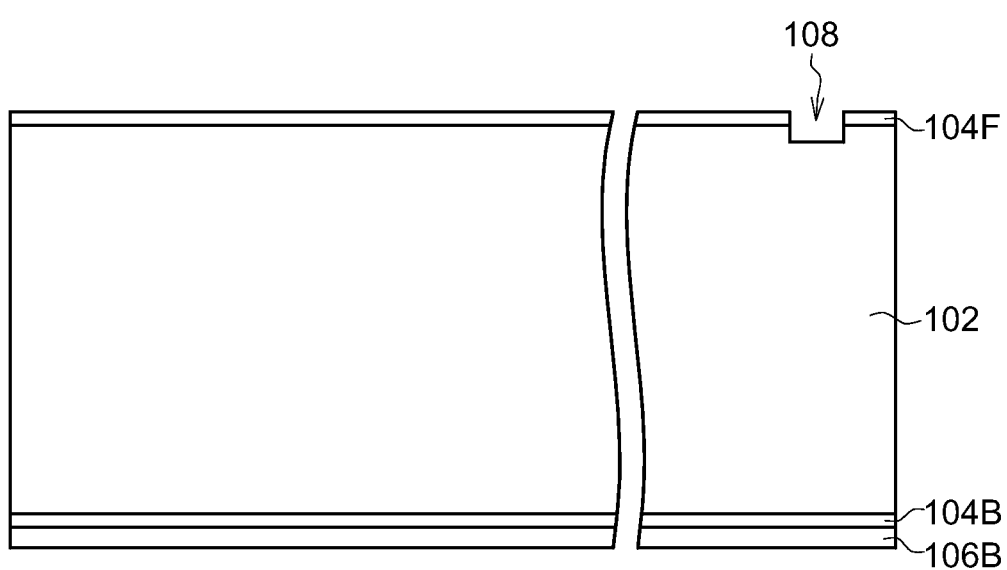

Referring to FIG. 1D, a mark 108 is formed. The mark 108 may be formed by lithography and etching processes, and a clean process may be carried out. The mark 108 may be used for the alignment during the formation of a through silicon via.

Figure 1E:
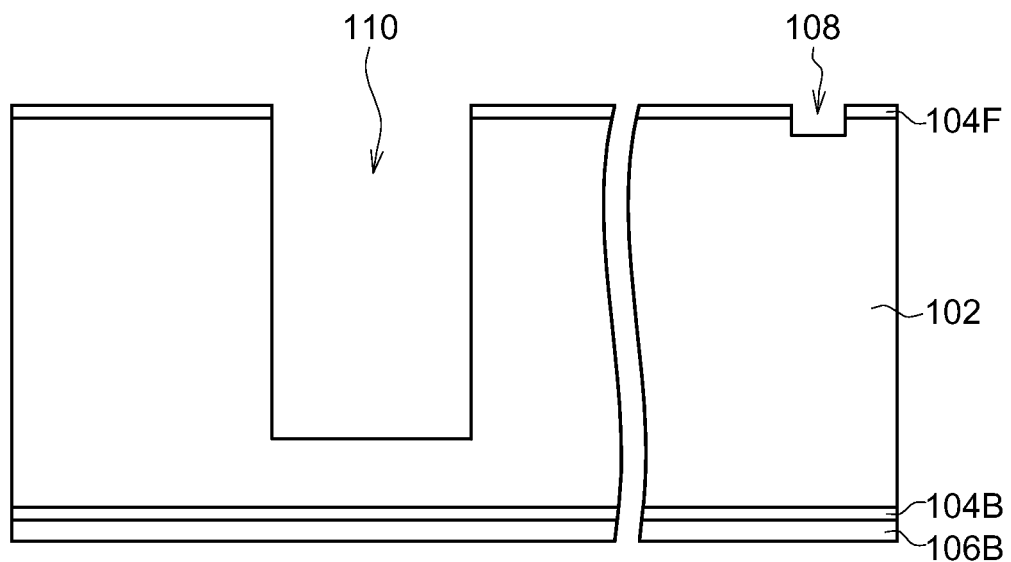
Figure 1F:
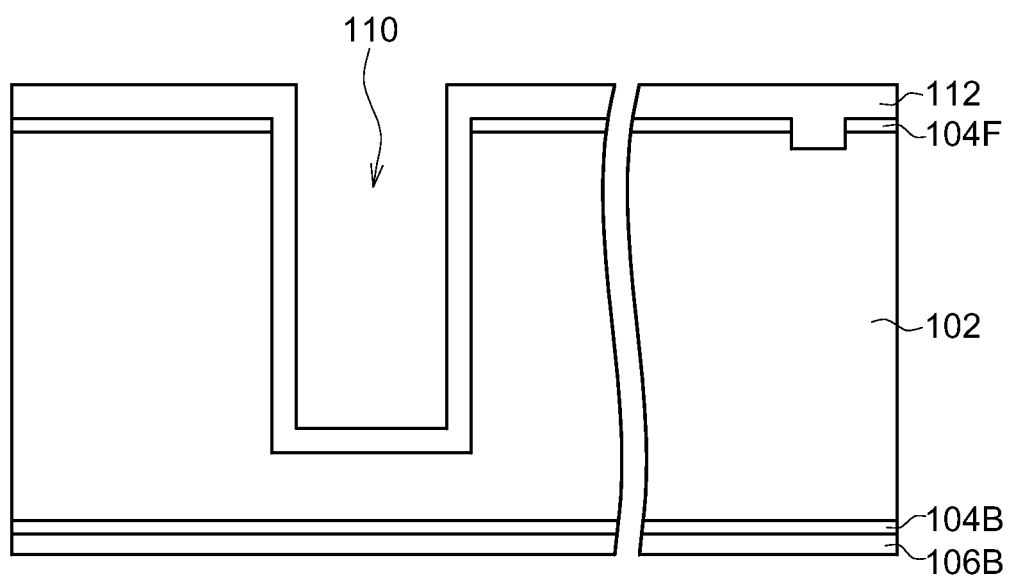
Figure 1G:
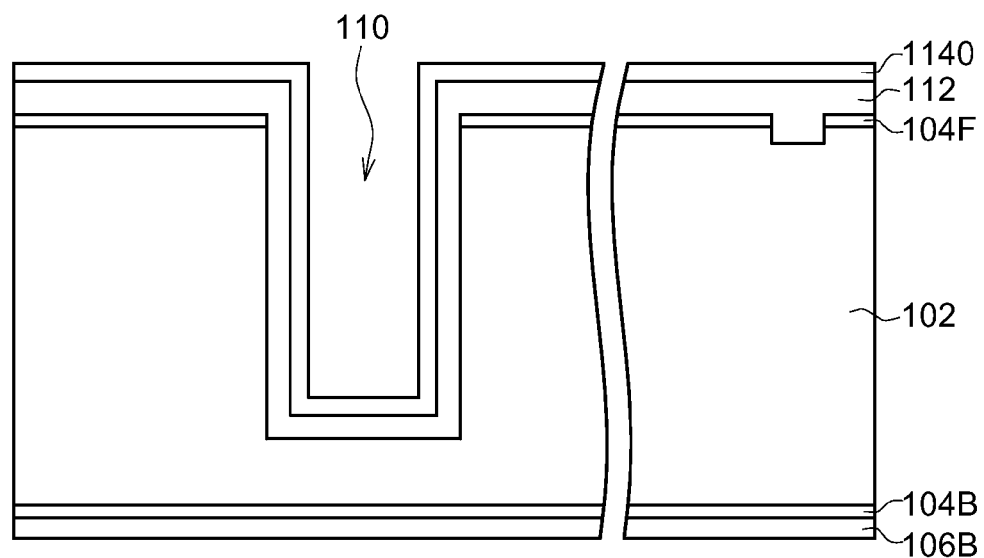
Figure 1H:
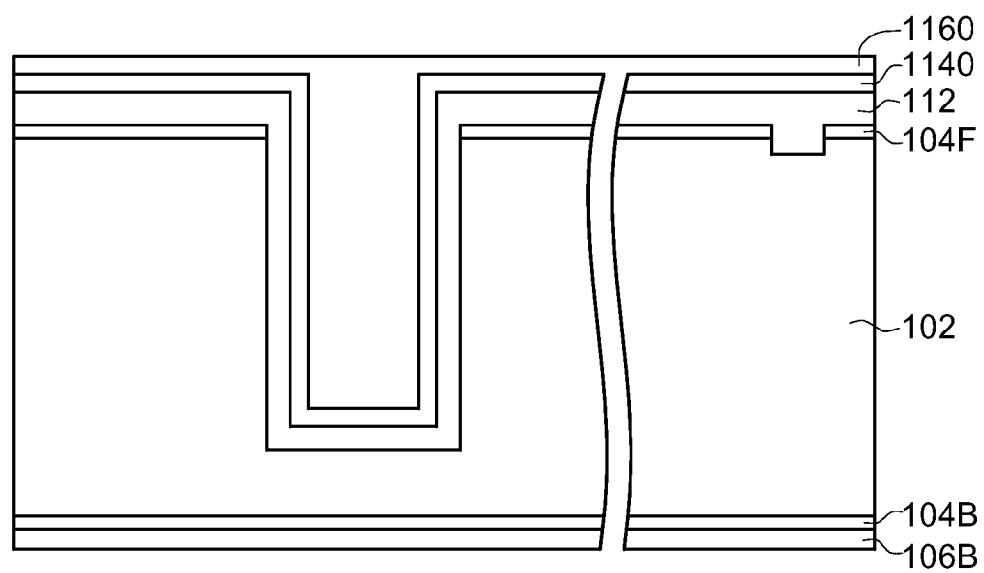
Figure 1I:
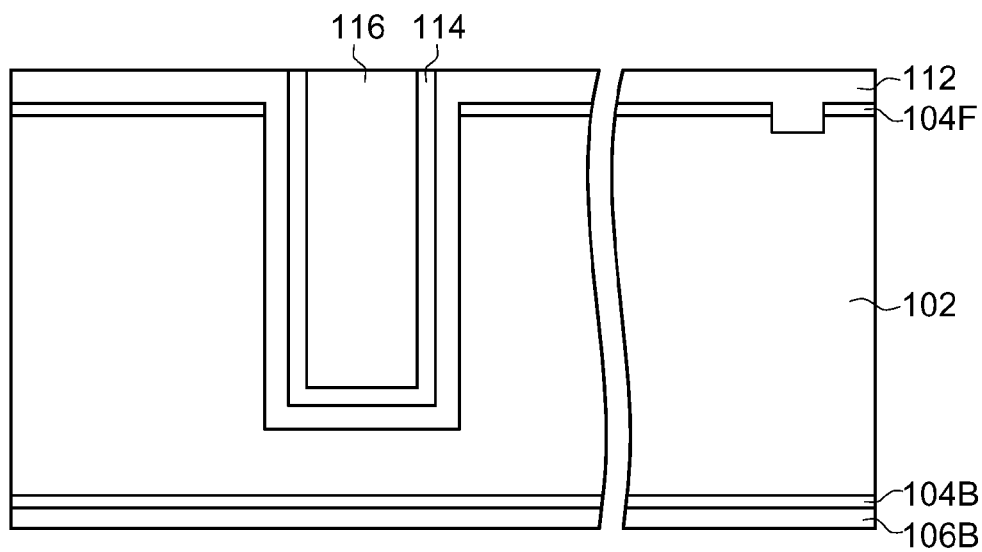

Referring to FIG. 1E, a through silicon via hole 110 is formed. The through silicon via hole 110 may be formed using the mark 108 for alignment. The through silicon via hole 110 may be formed by lithography and etching processes, and a clean process may be carried out. Referring to FIG. 1F, a liner layer 112 is formed in the through silicon via hole 110 and on the substrate 102. The liner layer 112 may be made of oxide, such as $SiO_2$. Referring to FIG. 1G, a first barrier layer 1140 is formed on the liner layer 112. The first barrier layer 1140 may be made of Ta and TaN. Referring to FIG. 1H, a first conductor 1160 is formed on the first barrier layer 1140 and completely filled the through silicon via hole 110. The first conductor 1160 may be formed by an electroplating process. The first conductor 1160 may be Cu. Then, the unneeded portions of the first barrier layer 1140 and the first conductor 1160 is removed, only the first barrier layer 114 and the first conductor 116 in the through silicon via hole 110 are remained, as shown in FIG. 1I. This step may be conducted by a chemical mechanical polishing (CMP) process. As such, the main elements of a through silicon via are formed.

Figure 1J:
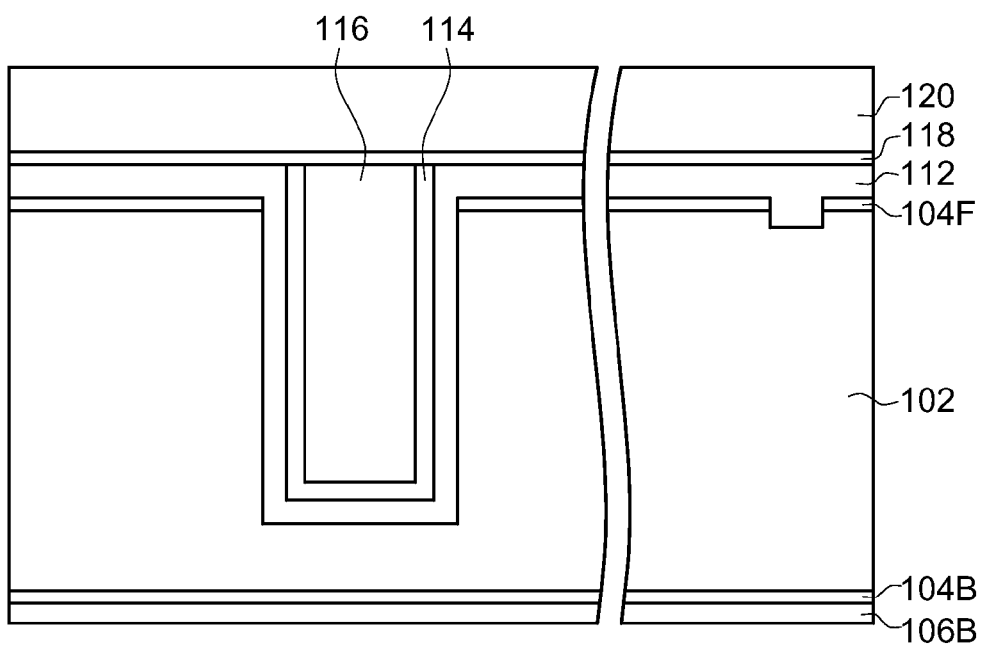
Figure 1K:
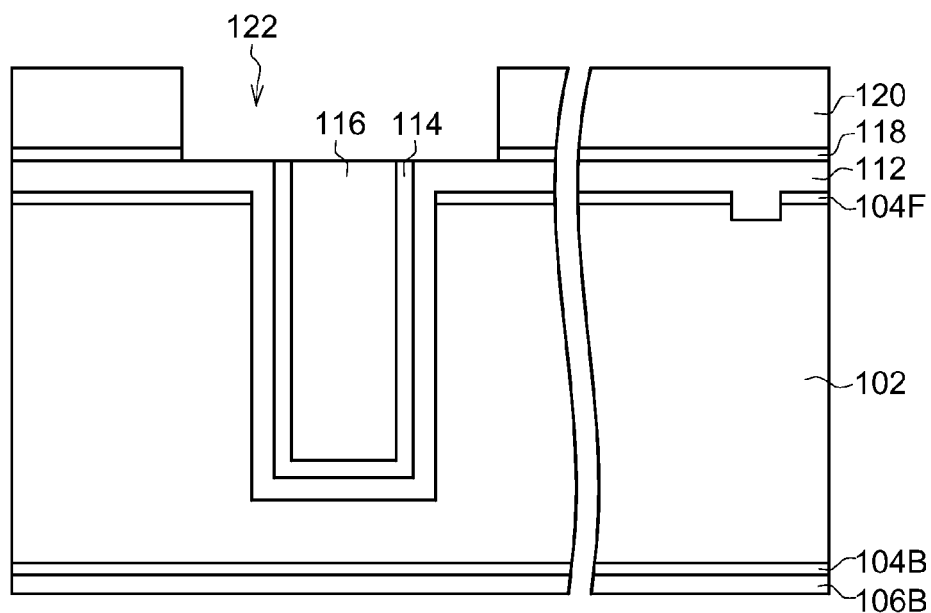
Figure 1L:
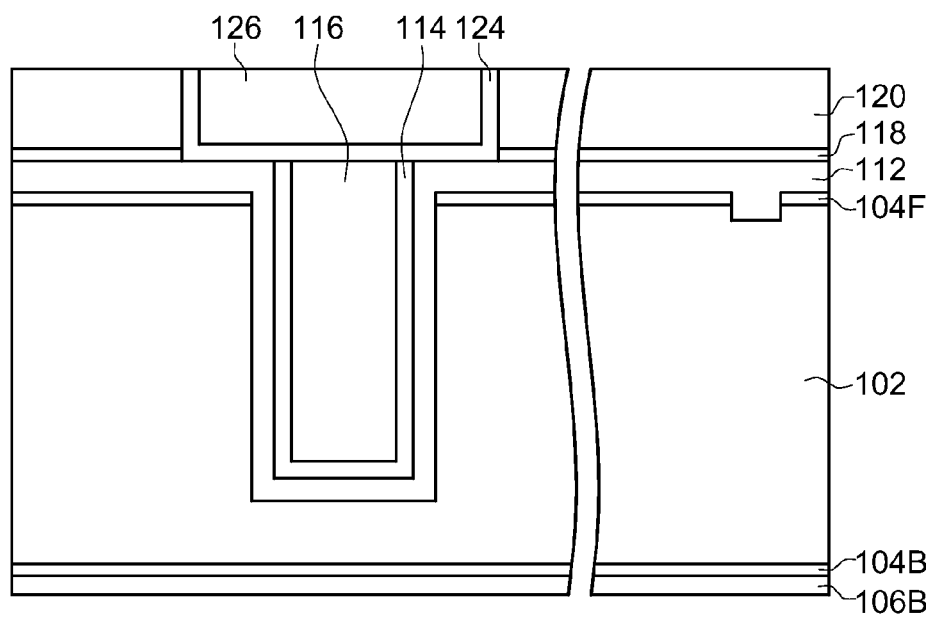

Referring to FIG. 1J, a stop layer 118 and an interlayer dielectric 120 may be sequentially formed on the substrate 102. The stop layer 118 may be made of nitride, such as SiN. The interlayer dielectric 120 may be made of oxide, such as $SiO_2$. Referring to FIG. 1K, an opening 122 is formed in the interlayer dielectric 120 and the stop layer 118, and corresponds to the through silicon via hole 110. The opening 122 may be formed by lithography and etching processes, and a clean process may be carried out. Then, referring to FIG. 1L, a second barrier layer 124 is formed in the opening 122, and a second conductor 126 is filled into the opening 122. Similar to the first barrier layer 114, the second barrier layer 124 may be made of Ta and TaN. Similar to the first conductor 116, the second conductor 126 may be Cu and formed by electroplating and CMP processes.

After the steps described above, the substrate 102 may be thinned from the back side 102b of the substrate 102 until the first conductor 116 in the through silicon via hole 110 is exposed. As such, the manufacture of the through silicon via is completed.

The semiconductor structure formed by the method according to this embodiment comprises a substrate 102, a through silicon via hole 110, a liner layer 112, a first conductor 116, an interlayer dielectric 120 and a second conductor 126. The through silicon via hole 110 is formed in the substrate 102. The liner layer 112 is formed on a bottom and a sidewall of the through silicon via hole 110. The first conductor 116 is filled in the through silicon via hole 110, and constitute the main part of a through silicon via. The interlayer dielectric 120 is formed on the substrate 102. The second conductor 126 is formed in an opening 122 of the interlayer dielectric 120 corresponding to the through silicon via hole 110, and constitute a part of a contact for the through silicon via.

The semiconductor structure may further comprise a first barrier layer 114 and a second barrier layer 124. The first barrier layer 114 is formed in the through silicon via hole 110, and the first conductor 116 is formed on the first barrier layer 114. The second barrier layer 124 is formed in the opening 122, and the second conductor 126 is formed on the second barrier layer 124. The semiconductor structure may further comprise a stop layer 118 under the interlayer dielectric 120.

Figure 2A:
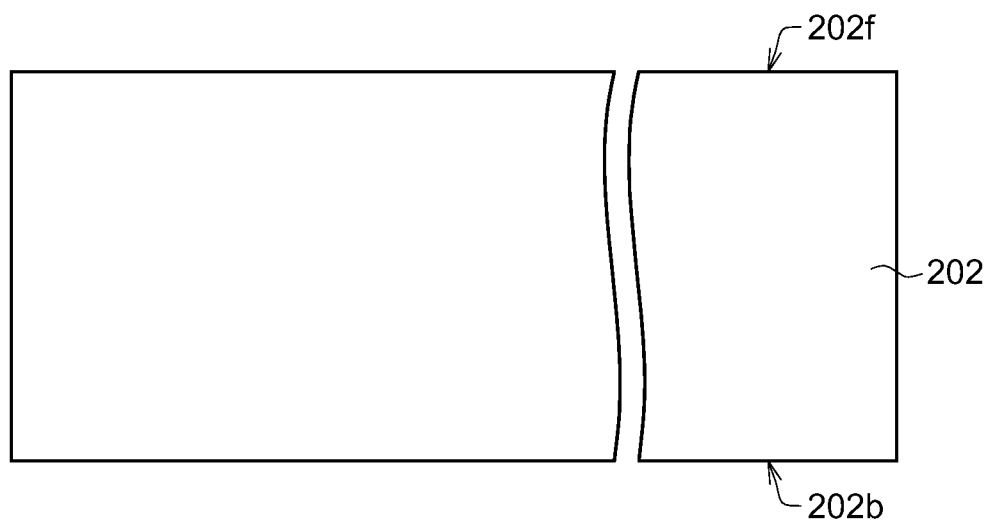
FIGS. 2A-2H illustrate a method for manufacturing a semiconductor structure according to another embodiment.
Figure 2B:
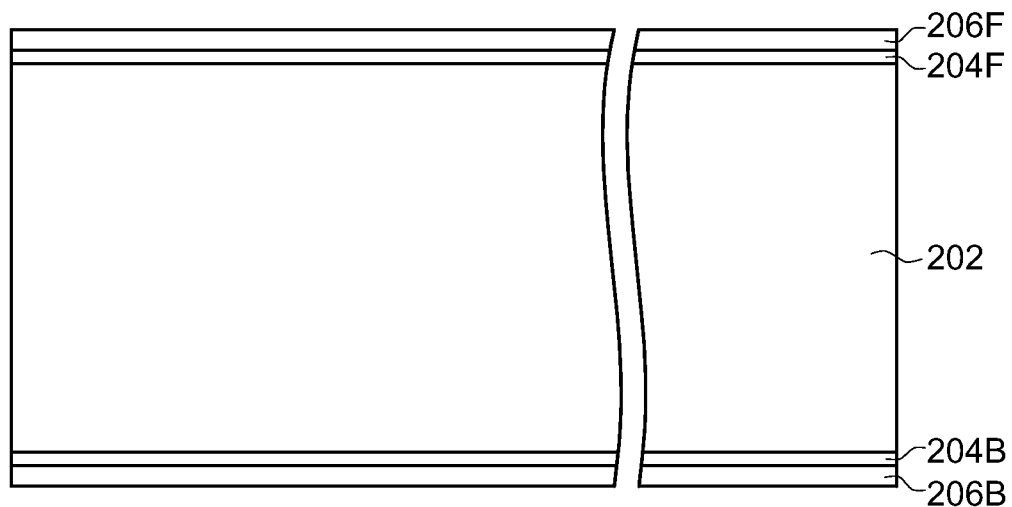

FIGS. 2A-2H illustrate a method for manufacturing a semiconductor structure according to another embodiment. Referring to FIG. 2A, a substrate 202 is provided. The substrate 202 has a front side 202f and a back side 202b. The substrate 202 may be made of Si. Referring to FIG. 2B, a first pad layer 204F/204B and a second pad layer 206F/206B are sequentially formed on the front side 202f and the back side 202b of the substrate 202. The first pad layer 204F/204B may be made of oxide, such as $SiO_2$. The second pad layer 206F/206B may be made of nitride, such as SiN.

Figure 2C:
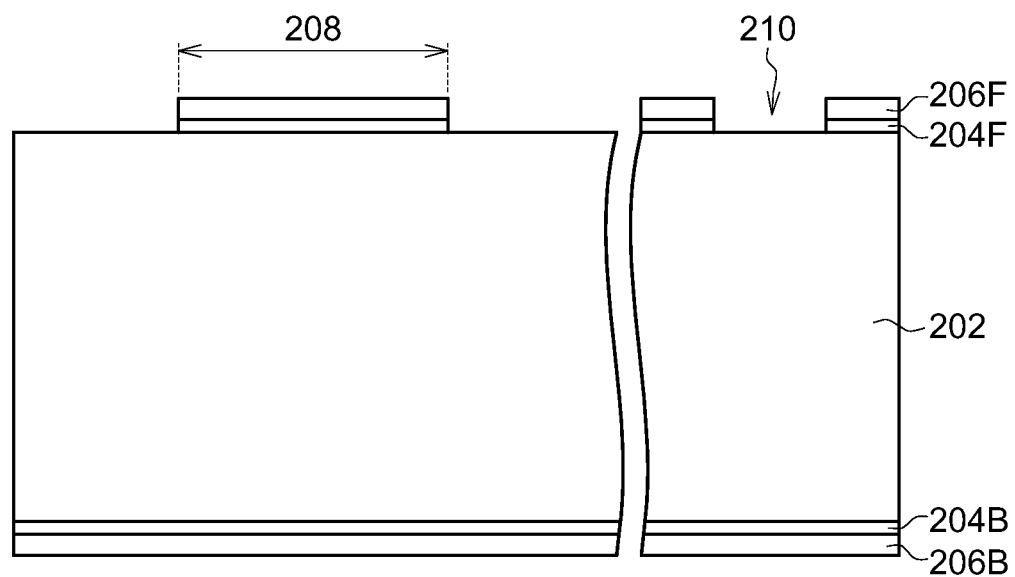

Referring to FIG. 2C, a defining region 208 and a mark 210 are concurrently formed by using the first pad layer 204F and the second pad layer 206F on the front side 202f of the substrate 202. This step may be conducted by lithography and etching processes, and a clean process may be carried out. The mark 210 may be used for the alignment during the formation of a through silicon via.

Figure 2D:
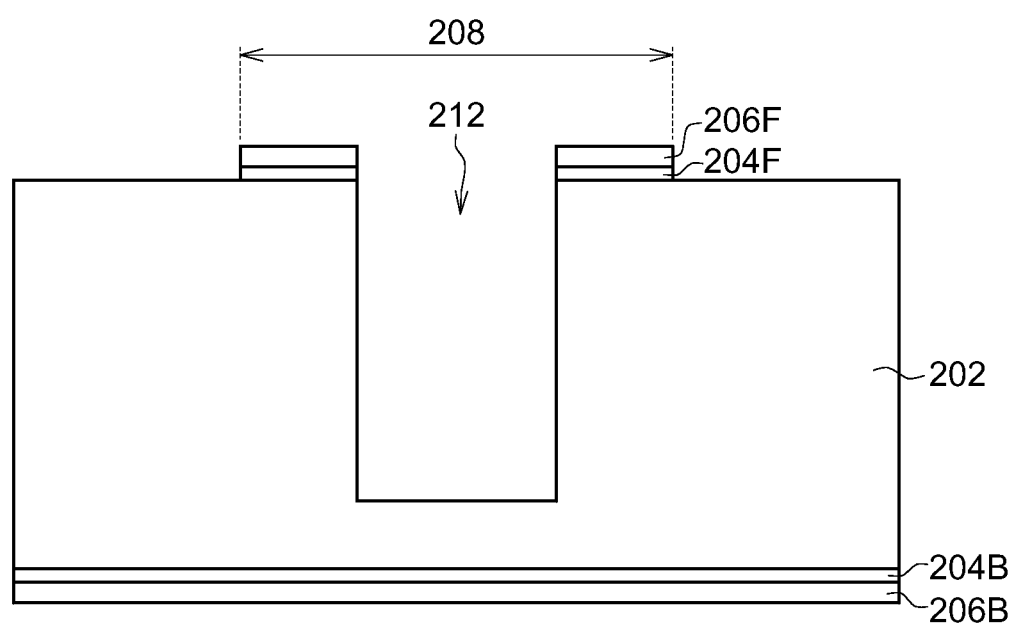
Figure 2E:
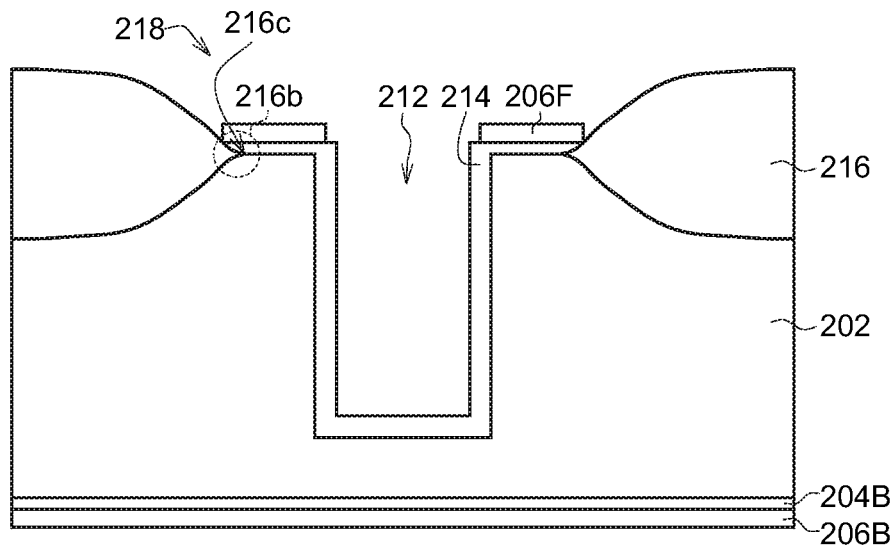
Figure 2F:
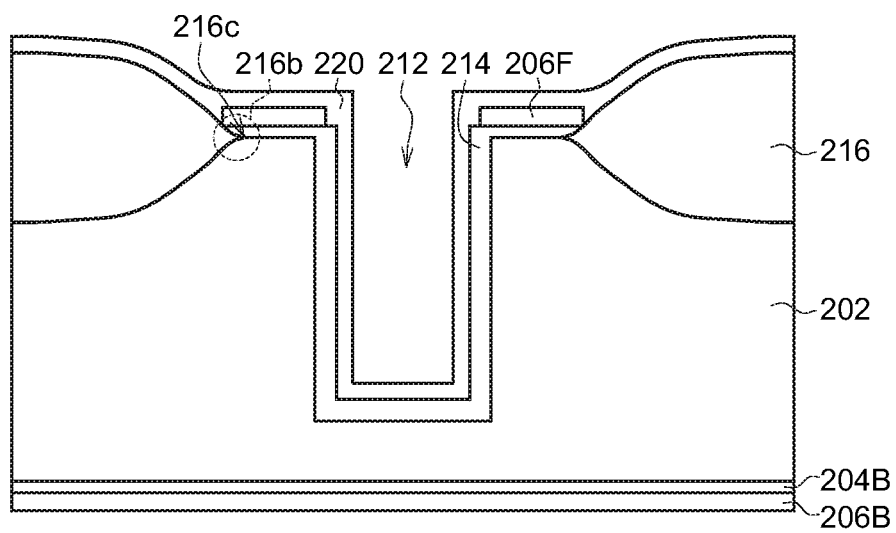
Figure 2G:
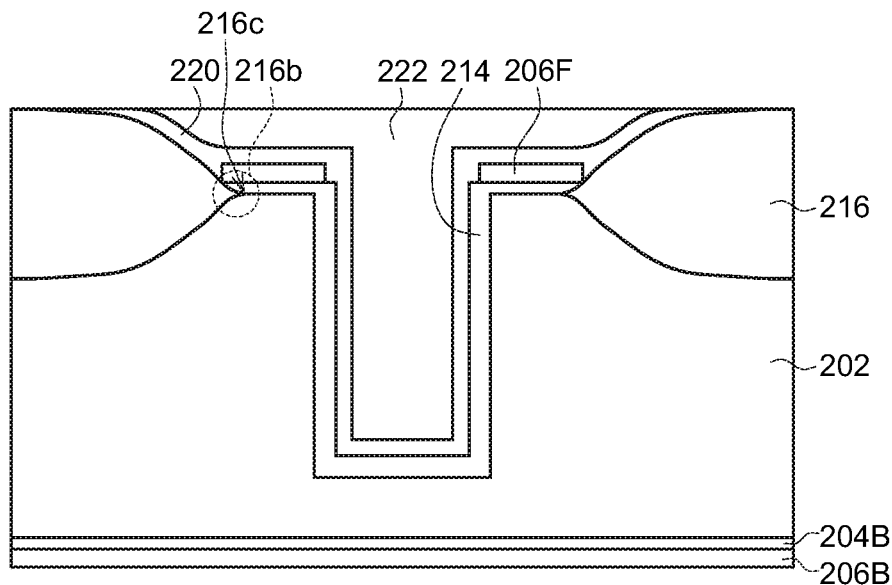

Referring to FIG. 2D, a through silicon via hole 212 is formed in the substrate 202 in the defining region 208. The through silicon via hole 212 may be formed using the mark 210 for alignment. The through silicon via hole 212 may be formed by lithography and etching processes, and a clean process may be carried out. Referring to FIG. 2E, a liner layer 214 is formed in the through silicon via hole 212 and an interlayer dielectric 216 is formed on the substrate 202 concurrently. The interlayer dielectric 216 defines an opening 218 corresponding to the through silicon via hole 212. The liner layer 214 and the interlayer dielectric 216 may be made of oxide and formed by a thermal oxidation process, such as a field oxide process. As such, the interlayer dielectric 216 comprises a bird beak portion 216b near the through silicon via hole 212, wherein the tip 216c of the bird beak portion 216b is on a level of a top surface of the substrate. Referring to FIG. 2F, a barrier layer 220 may be formed on the liner layer 214 and in the opening 218. The barrier layer 220 may be made of Ta and TaN. Referring to FIG. 2G, a conductor 222 is filled into the through silicon via hole 212 and the opening 218. The conductor 222 is formed on the barrier layer 220. The conductor 222 may be Cu. The conductor 222 may be formed by electroplating and CMP processes, wherein the CMP process is terminated at the interlayer dielectric 216. As such, the main elements of a through silicon via and a contact for the through silicon via are formed.

Figure 2H:
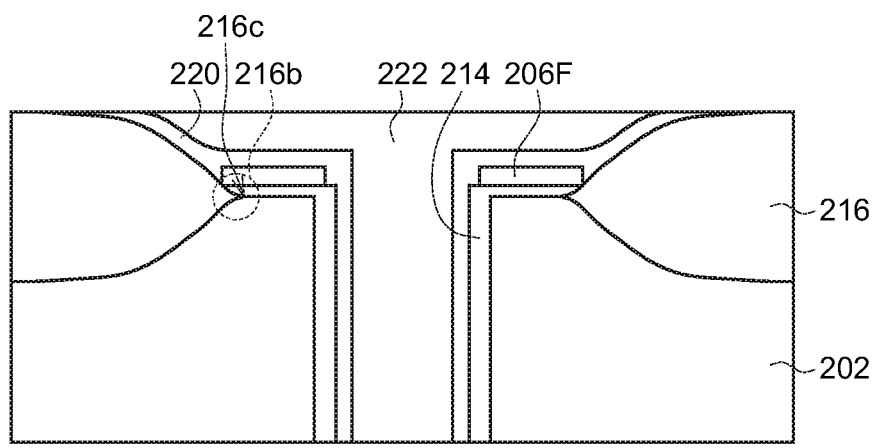

The method according to this embodiment may further comprises a step of thinning the substrate 202 from the back side 202b of the substrate 202 until the conductor 222 in the through silicon via hole 212 is exposed, as shown in FIG. 2H. As such, the manufacture of the through silicon via is completed.

Compared to the method described with respect to FIGS. 1A-1L, the method according to this embodiment comprises less steps. For example, in the method described with respect to FIGS. 1A-1L, the second conductor 126 forming the contact of the through silicon via and the first conductor 116 in the through silicon via hole 110 are separately formed, while in the method described with respect to FIGS. 2A-2H, the conductor 222 is formed integrally. Besides, in the method described with respect to FIGS. 1A-1L, the interlayer dielectric 120 and the liner layer 112 are separately formed, while in the method described with respect to FIGS. 2A-2H, the liner layer 214 is formed in the through silicon via hole 212 and the interlayer dielectric 216 is formed on the substrate 202 concurrently. As such, the manufacturing time is saved, and the cost is decreased. More specifically, the manufacturing time can be saved about 40%, and the cost may be decreased about 70 USD.

The semiconductor structure formed by the method according to this embodiment comprises a substrate 202, a through silicon via hole 212, an interlayer dielectric 216, a liner layer 214 and a conductor 222. The through silicon via hole 212 is formed in the substrate 202. The interlayer dielectric 216 is formed on the substrate 202. The interlayer dielectric 216 defines an opening 218 corresponding to the through silicon via hole 212. The interlayer dielectric 216 comprises a bird beak portion 216b near the through silicon via hole 212. The liner layer 214 is formed on a bottom and a sidewall of the through silicon via hole 212. The conductor 222 is filled in the through silicon via hole 212 and the opening 218. The semiconductor structure may further comprise a barrier layer 220. The barrier layer 220 is formed on the liner layer 214 and in the opening 218, and the conductor 222 is formed on the barrier layer 220.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A method for manufacturing a semiconductor structure, comprising:

providing a substrate, the substrate having a front side and a back side;

forming a first pad layer and a second pad layer sequentially on the front side and the back side of the substrate;

concurrently forming a defining region and a mark using the first pad layer and the second pad layer on the front side of the substrate;

forming a through silicon via hole in the substrate in the defining region;

concurrently forming a liner layer in the through silicon via hole and forming an interlayer dielectric on the substrate, wherein the interlayer dielectric defines an opening corresponding to the through silicon via hole, and the interlayer dielectric comprises a bird beak portion near the through silicon via hole; and filling a conductor into the through silicon via hole and the opening.

2. The method structure according to claim 1, further comprising:

forming a barrier layer on the liner layer and in the opening, wherein the conductor is formed on the barrier layer.

3. The method structure according to claim 2, wherein the barrier layer is made of Ta and TaN.

4. The method structure according to claim 1, wherein the substrate is made of Si.

5. The method structure according to claim 1, wherein the first pad layer is made of oxide, and the second pad layer is made of nitride.

6. The method structure according to claim 1, wherein the liner layer and the interlayer dielectric are made of oxide.

7. The method structure according to claim 1, wherein the conductor is Cu.

8. The method structure according to claim 1, further comprising:

thinning the substrate from the back side of the substrate until the conductor in the through silicon via hole is exposed.

9. A semiconductor structure, comprising:

a substrate;

a through silicon via hole formed in the substrate;

an interlayer dielectric formed on the substrate, the interlayer dielectric defining an opening corresponding to the through silicon via hole, the interlayer dielectric comprising a bird beak portion, wherein a tip of the bird beak portion is on a level of a top surface of the substrate;

a liner layer formed on a bottom and a sidewall of the through silicon via hole; and a conductor filled in the through silicon via hole and the opening.

10. The semiconductor structure according to claim 9, further comprising:

a barrier layer formed on the liner layer and in the opening, wherein the conductor is formed on the barrier layer.

11. The semiconductor structure according to claim 10, wherein the barrier layer is made of Ta and TaN.

12. The semiconductor structure according to claim 9, wherein the substrate is made of Si.

13. The semiconductor structure according to claim 9, wherein the interlayer dielectric and the liner layer are made of oxide.

14. The semiconductor structure according to claim 9, wherein the conductor is Cu.

* * * * *